US006781762B2

United States Patent
Ozawa

(10) Patent No.: US 6,781,762 B2
(45) Date of Patent: Aug. 24, 2004

(54) METHOD OF MANUFACTURING MICROLENS, MICROLENS, MICROLENS ARRAY PLATE, ELECTROOPTIC DEVICE AND ELECTRONIC EQUIPMENT

(75) Inventor: Norihiko Ozawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/453,692

(22) Filed: Jun. 4, 2003

(65) Prior Publication Data

US 2004/0027680 A1 Feb. 12, 2004

(30) Foreign Application Priority Data

Jun. 12, 2002 (JP) .......................................... 2002-171892
May 7, 2003 (JP) .......................................... 2003-129252

(51) Int. Cl.[7] .......................... G02B 27/10; B29D 11/00
(52) U.S. Cl. ........................ 359/619; 359/620; 359/622; 264/1.7; 216/26
(58) Field of Search ................................. 359/619–622, 359/599, 463, 455; 264/1.32, 1.7; 216/26, 51, 55, 97; 65/17.3

(56) References Cited

U.S. PATENT DOCUMENTS 6,469,832 B2 * 10/2002 Yotsuya et al. ............. 359/619

FOREIGN PATENT DOCUMENTS

| JP | A 09-127496 | 5/1997 |
| JP | A 2002-006113 | 1/2002 |

* cited by examiner

Primary Examiner—Georgia Epps
Assistant Examiner—Jack Dinh
(74) Attorney, Agent, or Firm—Oliff & Berridge, PLC

(57) ABSTRACT

A method of manufacturing a microlens includes: forming on a transparent substrate a first film which has an etching rate higher than the transparent substrate, forming on the first film a mask in which a pit is provided at a position corresponding to a center of the microlens to-be-formed, and wet-etching the first film and the transparent substrate through the mask, to thereby excavate in the transparent substrate a non-spherical recess which defines a curved surface of the microlens.

11 Claims, 9 Drawing Sheets

METHOD OF MANUFACTURING MICROLENS, MICROLENS, MICROLENS ARRAY PLATE, ELECTROOPTIC DEVICE AND ELECTRONIC EQUIPMENT

BACKGROUND OF THE INVENTION

1. Field of Invention

The present invention relates to a method of manufacturing a microlens which constitutes, for example, a microlens array plate suited for application to an electrooptic device, such as a liquid crystal device. The invention further relates to a microlens manufactured by the manufacturing method, a microlens array plate, an electrooptic device including the microlens, and an electronic equipment including the electrooptic device.

2. Description of Related Art

In a related art electrooptic device, such as a liquid crystal device, various wiring lines, such as data lines, scanning lines and capacitance lines, and various electronic elements, such as thin film transistors (hereinbelow "TFTs") or thin film diodes (hereinbelow "TFDs"), are formed within an image display area. In each pixel, therefore, a region through or from which light capable of actually contributing to display is transmitted or reflected is essentially limited due to the existence of the various wiring lines and electronic elements, etc. Specifically, regarding each pixel, the opening rate of each pixel as is the rate of a region through or from which light actually contributing to display is transmitted or reflected (that is, the aperture region of each pixel), to the whole region, is about 70%, for example. Illumination source light or external light which is entered into the electrooptic device mostly includes parallel light rays, at least, when passing through an electrooptic substance layer, such as a liquid crystal layer, within the electrooptic device. However, in a case where parallel light rays have been entered into the electrooptic device, only that part of the whole quantity of light which is proportional to the opening rate of each pixel can be utilized without any contrivance.

Therefore, in the related art, a microlens array which includes microlenses corresponding to the respective pixels can be formed in an opposite substrate, or a microlens array plate can be stuck on an opposite substrate. Due to such microlenses, light rays which ought to progress toward the non-aperture regions of the respective pixels except the aperture regions thereof without the microlenses are collected in pixel units, so as to be guided into the aperture regions of the respective pixels when they are transmitted through the electrooptic substance layer. As a result, a bright display is realized by utilizing the microlens array in the electrooptic device.

The manufacture of this type of related art microlens is provided as stated below. First, a mask which is provided with a pit at a position corresponding to the center of the microlens to be formed is formed on, for example, a transparent substrate. Subsequently, the transparent substrate is subjected to wet etching through the mask, to thereby excavate a spherical recess which defines the curved surface of the microlens. Thereafter, the mask is removed, and the recess is filled up with a transparent medium of high refractivity. Thus, the microlens is formed in which a hemispherical recess centering around the pit having been first provided in the mask is included as a lens spherical surface. The microlens array can be manufactured by forming a large number of such microlenses in the shape of an array.

In the case of this type of microlens, it is important as basic requirements to enhance a lens efficiency and further to diminish spherical aberration.

According to the related art method of manufacturing the microlens as stated above, however, a non-spherical lens cannot be manufactured, although a spherical lens can be manufactured, comparatively easily.

In this regard, in order to manufacture the non-spherical lens, the related art includes a complicated and high-degree manufacturing method, for example, one in which a non-spherical recess is formed from a separate material on a substrate and is thereafter transferred onto the side of the substrate, or one in which a substrate is subjected to a plurality of different etching steps stage by stage. Such a manufacturing method, however, is basically difficult and increases manufacturing costs as well as reduces an available percentage. Further, there occurs the problem that, as manufacturing steps become complicated and high in degree, controlling the degree of non-sphericalness in the non-spherical lens becomes technically very difficult.

SUMMARY OF THE INVENTION

The present invention addresses or solves the above and/or other problems, and provides a method of manufacturing a microlens that is capable of manufacturing the non-spherical microlens comparatively easily. The invention also provides the microlens which is manufactured by the manufacturing method, an electrooptic device which includes the microlens, and an electronic equipment which includes the electrooptic device.

In order to address or solve the above, a method of manufacturing a microlens according to the present invention includes: forming on a substrate a first film an etching rate of which for a predetermined kind of etchant differs from that of the substrate; forming on the first film a mask in which a pit is provided at a position corresponding to a center of the microlens to-be-formed; and performing wet etching through the mask, to thereby excavate in the substrate a non-spherical recess which defines a curved surface of the microlens.

In accordance with the method of manufacturing a microlens according to the present invention, first of all, the substrate, for example, a quartz substrate or a glass substrate is formed thereon with the first film the etching rate of which for the predetermined kind of etchant, for example, one of hydrofluoric acid type differs from that of the substrate. Such a first film is formed by, for example, CVD (Chemical Vapor Deposition) or sputtering. Subsequently, the mask in which the pit is provided at the position corresponding to the center of the microlens to-be-formed is formed on the first film. Such a mask may well be formed in such a way, for example, that a second film is formed on one surface of the first film by CVD, sputtering or the like, whereupon it is patterned by photolithography and etching so as to provide the pit. Alternatively, the mask may well be formed directly on the region of the first film except the pit. Thereafter, the first film and the substrate are wet-etched through such a mask. The etching rates for the etchant employed here differ from each other between the first film and the substrate. Therefore, before the etching penetrates through the first film, a spherical recess is excavated in the part of the first film around the pit, by the wet etching which has no directionality. After the penetration, however, a non-spherical recess is excavated because the degree to which the first film is etched and the degree to which the substrate is etched are different from each other.

Thereafter, the non-spherical microlens can be manufactured comparatively easily by utilizing the curved surface which the non-spherical recess thus excavated defines. By way of example, it is permitted to manufacture the non-spherical micro lens by making the substrate a transparent one and filling up the recess with a transparent medium. Alternatively, it is permitted to manufacture the non-spherical microlens by utilizing the recess as a mold. Further, it is permitted to manufacture the microlens being a biconvex lens, by preparing two substrates, each of which is formed with such a microlens, and then sticking them to each other.

In an aspect of the method of manufacturing a microlens according to the present invention, the first film is higher in the etching rate than the substrate.

In accordance with this aspect, due to the etching, the recess in the shape of a pan whose bottom is shallower than a hemisphere is excavated in the substrate unlike in the first film which is higher in the etching rate than the substrate.

In another aspect of the method of manufacturing a microlens according to the present invention, the substrate is made of a transparent substrate; and the step of putting into the recess a transparent medium which has a refractivity higher than that of the transparent substrate is further provided.

According to this aspect, the transparent medium the refractivity of which is higher than the transparent substrate is put into the recess which is excavated in the substrate made of the transparent substrate, and hence, it is permitted to manufacture the microlens as a non-spherical convex lens on the transparent substrate. On this occasion, the transparent medium is made of a transparent resin or the like, and it may well serve as an adhesive. By way of example, it may well serve as the adhesive in the case of sticking a cover glass onto the transparent substrate.

The transparent substrate can also be made of a quartz, for example. In this case, advantageously the quartz substrate is not destroyed even when exposed to high temperatures in forming the first film. However, in a case where the first film is formed at a low temperature, refractoriness is not required of the transparent substrate. The transparent substrate may be, for example, a glass plate or a plastic or resin plate. No problem occurs as long as the transparent substrate is made of a substance which can be etched by the predetermined kind of etchant together with the first film.

In the case where the recess excavated in the substrate is employed as the mold of the microlens, the substrate need not be transparent.

In another aspect of the method of manufacturing a microlens according to the present invention, the first film is made of a transparent film or an opaque film.

In accordance with this aspect, even when the first film is left intact around the recess after the recess has been excavated by the etching, an optical performance concerning the microlens undergoes almost no, or substantially no, negative influence by constructing the first film out of the transparent film. Further, the vicinity of the edge of the recess as is made of the first film can also be employed as the vicinity of the edge of the non-spherical lens.

However, the first film part left around the recess lies at the edge of the optical path of light which is collected by the microlens, so that even when the first film is formed of a semitransparent film or the opaque film, a bad influence which is exerted on the optical performance concerning the microlens is limited.

In another aspect of the method of manufacturing a microlens according to the present invention, the first film is made of a silicon oxide film or a silicon nitride film.

In accordance with this aspect, the first film which has the etching rate different from that of the substrate can be formed comparatively easily. By way of example, the silicon oxide film whose thickness and quality are stable can be formed on the quartz substrate comparatively easily by CVD or sputtering. Moreover, the first film which is transparent as in the above aspect can be formed of the silicon oxide film.

In another aspect of the method of manufacturing a microlens according to the present invention, the etching rate is controlled by condition setting which concern at least one of a sort of the first film, a method of forming the first film, a condition to form the first film, and a temperature of a heat treatment after the formation of the first film.

In accordance with this aspect, the etching rate is controlled by the condition setting which concerns at least one of the sort of the first film relating to, for example, a substance, a density and a porosity; forming the first film, for example, CVD or sputtering; the temperature to form the first film, for example, one below about 400° C. or one of about 400–1000° C.; and the temperature of the heat treatment after the formation of the first film. Besides, due to such a control of the etching rate, a curvature or a curvature distribution in a non-spherical surface which the recess to be finally obtained defines can be controlled comparatively easily. The curvature or the curvature distribution in the non-spherical surface which the recess to be finally obtained defines can also be controlled by the thickness of the first film.

In another aspect of the method of manufacturing a microlens according to the present invention, the mask is made of a poly-silicon film, an amorphous silicon film or a hydrofluoric acid-proof film.

In accordance with this aspect, the mask in which the pit is provided at the predetermined position can be formed on the first film made of, for example, the silicon oxide film, comparatively easily by, for example, the CVD or the sputtering.

In another aspect of the method of manufacturing a microlens according to the present invention, a plurality of such microlenses are formed in the shape of an array on the substrate.

In accordance with this aspect, a microlens array is manufactured in which a plurality of non-spherical microlenses as stated above are formed in the shape of the array. Therefore, the microlens array which is well suited for application to, for example, an electrooptic device where pixels are arrayed in the shape of an array or a matrix can be manufactured comparatively easily.

In order to address or solve the above, a microlens according to the present invention is manufactured by the method of manufacturing a microlens according to the present invention as stated above (including the various aspects thereof).

The microlens according to the present invention is manufactured by the method of manufacturing a microlens according to the present invention as stated above, so that it can collect illumination source light, external light, etc. with a slight spherical aberration and at a high efficiency, and it can realize the microlens, and further a microlens array or a microlens array plate, which are easily manufactured, which are comparatively inexpensive and whose qualities are stable.

In a case where the microlens according to the present invention is formed directly on the substrate, it has the structural feature peculiar to the present invention, that the boundary between the first film and the substrate exists in the vicinity of the edge of the lens curved surface being non-spherical and that the curvature of the lens curved surface changes remarkably at the boundary. Alternatively, in a case where the microlens according to the present invention is formed through a mold by the 2P method or the like, it has the structural feature peculiar to the present invention, that the curvature of the lens curved surface changes remarkably at a position which corresponds to the boundary between the first film and the substrate in the vicinity of the edge of the lens curved surface being non-spherical.

A microlens array plate according to the present invention includes a large number of microlenses; a transparent member which has concavities that define bottoms of the microlenses; a film which is formed on the transparent member, and which has pits that are formed in correspondence with the concavities and that define edges of the microlenses; and a cover member which is formed on the film. The sectional shape of each of the microlenses is semi-elliptical.

A microlens array plate according to the present invention should preferably be provided such that a sectional shape in the vicinity of a region featuring an angle of 50–60 degrees, which a tangential line to a lens surface in the film forms with respect to a tangential line to an edge of a lens surface defined by the transparent member, is semielliptical.

A microlens array plate according to the present invention should preferably be provided such that a sectional shape of the lens surface in the film is rectilinear.

In order to address or solve the above, an electrooptic device according to the present invention includes the microlens according to the present invention as stated above; a displaying electrode which opposes the microlens; and a wiring line or an electronic element which is connected to the displaying electrode.

The electrooptic device according to the present invention includes the microlens according to the present invention as stated above, so that it can collect illumination source light, external light, etc. with a slight spherical aberration and at a high efficiency by the non-spherical microlens, and it can realize the electrooptic device which is capable of displaying a bright and vivid image. Such an electrooptic device can be constructed as a liquid crystal device of active matrix drive type or the like electrooptic device in which the wiring lines, such as scanning lines and data lines, and the electronic elements, such as TFTs or TFDs, are connected to the displaying electrodes, such as insular pixel electrodes or stripe-shaped electrodes.

In order to address or solve the above, an electronic equipment according to the present invention includes the electrooptic device according to the present invention as stated above.

The electronic equipment according to the present invention includes the electrooptic device according to the present invention as stated above, so that it can realize various operations, such as those of a projector, a liquid crystal TV receiver, a portable telephone, an electronic notebook, a word processor, a video tape recorder of view finder type or monitor direct view type, a workstation, a video telephone, a POS terminal and a touch panel, for example, which are bright and which have excellent display qualities.

Such operations and other advantages of the present invention will be clarified by exemplary embodiments described below.

DETAILED DESCRIPTION OF PREFERRED EMBODIMENTS

Exemplary embodiments of the present invention are described below with reference to the drawings.

(Microlens Array Plate)

Figure 1:
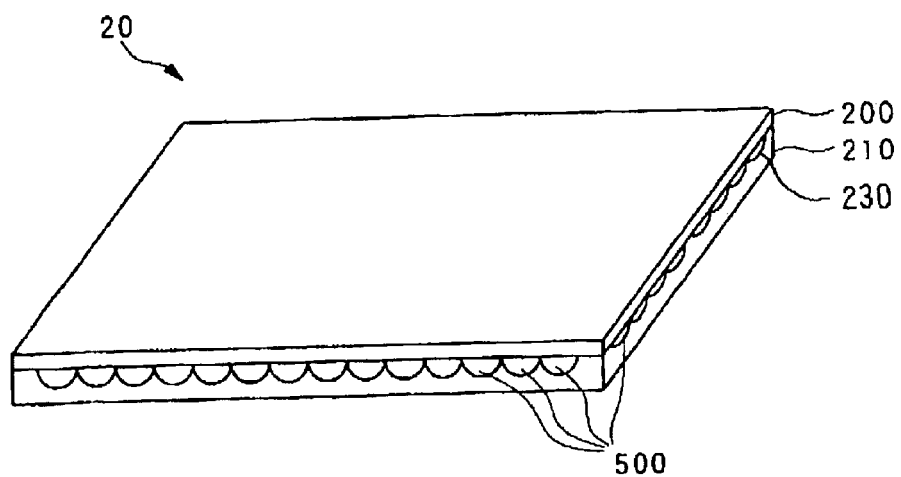
FIG. 1 is a schematic perspective view of an exemplary embodiment concerning the microlens array plate of the present invention.
Figure 2:
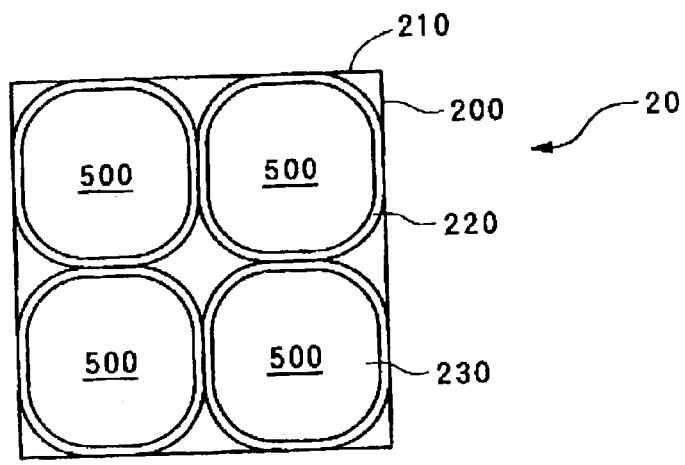
FIG. 2 is a partial enlarged plan view showing on an enlarged scale a part which concerns four microlenses in the exemplary embodiment concerning the microlens array plate.
Figure 3:
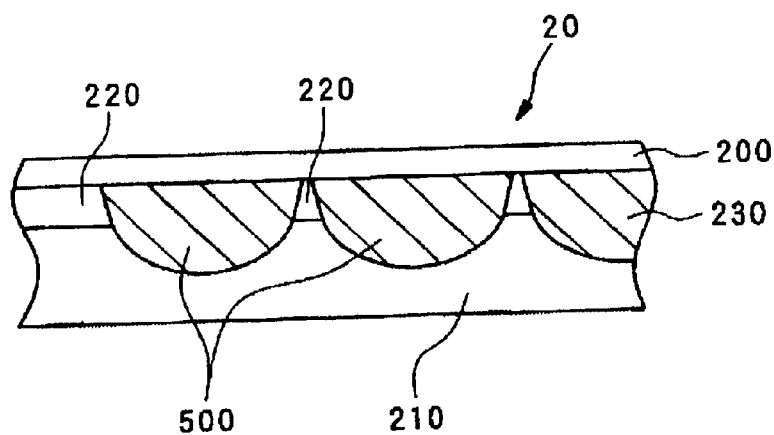
FIG. 3 is a partial enlarged sectional view of the exemplary embodiment concerning the microlens array plate.
Figure 4:
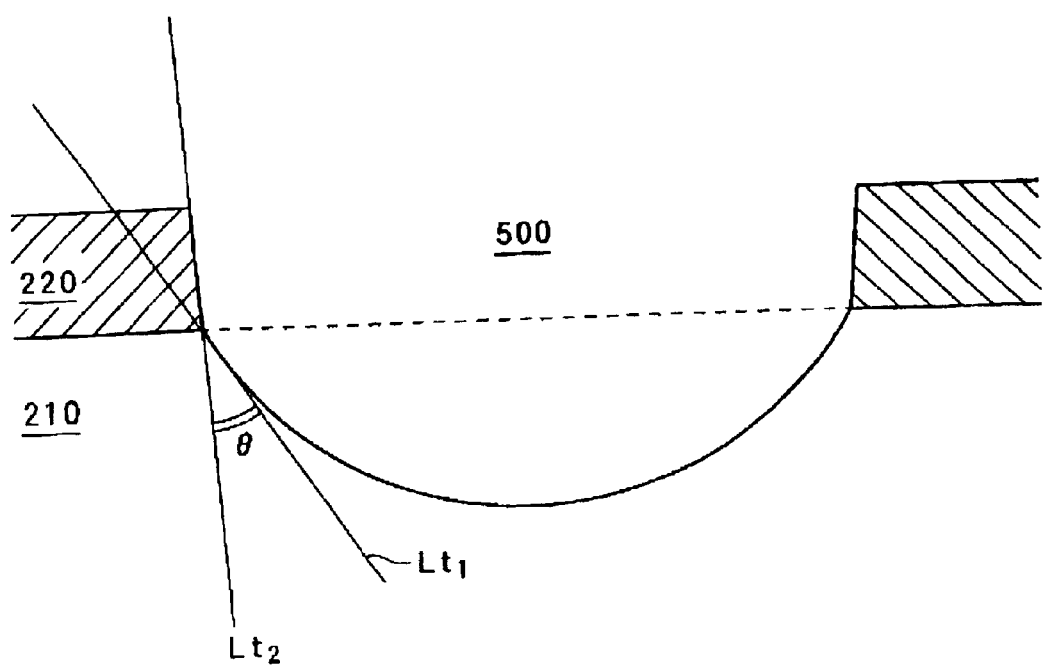
FIG. 4 is a partial enlarged sectional view further showing on an enlarged scale a part which concerns one microlens in the exemplary embodiment concerning the microlens array plate.
Figure 5:
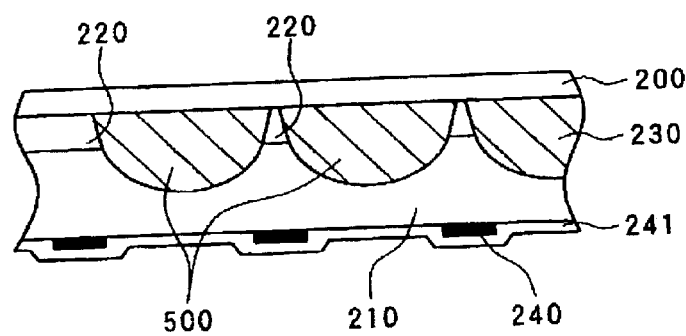
FIG. 5 is a partial enlarged sectional view in a modified exemplary embodiment of the microlens array plate of the present invention.

First, a microlens array plate which can be manufactured by a method of manufacturing a microlens according to the present invention is described below with reference to FIGS. 1 through 5. FIG. 1 is a schematic perspective view of a microlens array plate, FIG. 2 is a partial enlarged plan view showing on an enlarged scale a part which concerns four microlenses in the microlens array plate of this exemplary embodiment, FIG. 3 is a partial enlarged sectional view of the microlens array plate of this exemplary embodiment, and FIG. 4 is a partial enlarged sectional view further showing on an enlarged scale a part which concerns one microlens. FIG. 5 is a partial enlarged sectional view of a microlens array plate in a modified exemplary embodiment.

As shown in FIG. 1, the microlens array plate 20 of this exemplary embodiment includes a transparent plate member 210 which is made of, for example, a quartz plate, and which is covered with a cover glass 200. In the transparent plate member 210, a large number of concavities are excavated in the shape of a matrix. Besides, the concavities are filled up with transparent bonding layers 230 which bond the cover glass 200 and the transparent plate member 210 to each other, which are formed by hardening an adhesive made of, for example, a photosensitive resin material, and which have a refractivity higher than that of the transparent plate member 210. A large number of microlenses 500 which are planarly arrayed in the shape of the matrix, are constructed of these constituents.

In this manner, in this exemplary embodiment, one example of a "substrate" according to the present invention is constructed of the transparent plate member 210, and one example of a "transparent medium" according to the present invention is constructed of the bonding layer 230.

As shown in FIGS. 2 and 3, the curved surface of each microlens 500 is significantly or mainly defined by the transparent plate member 210 and the bonding layer 230 whose refractivities are different from each other. Besides, each microlens 500 is constructed as a convex lens which protrudes downwards as viewed in FIG. 3.

In this exemplary embodiment, the microlens array plate is manufactured especially by the manufacturing method peculiar to the present invention as stated below, and hence, a first film 220 is left in the vicinity of the edge of each microlens 500, as well as on the upper surface of that region of the transparent plate member 210 in which the microlens 500 is not formed. The first film 220 is made of, for example, a transparent silicon oxide film, and it lies in close contact with the cover glass 200 through the adhesive layer 230.

The microlens array plate 20 has each microlense 500 arranged so that, in the use of this plate, they may correspond to the respective pixels of the electrooptic device, for example, the liquid crystal device to be described later. Accordingly, incident light rays entering into the central part of each microlens 500 are collected toward the center of the corresponding pixel in the electrooptic device by the refraction of each microlens 500.

As shown in FIGS. 3 and 4, at the edge part of each microlens 500, the curved surface thereof rises abruptly relative to the plane of the cover glass 200 or the plane of the transparent plate member 210. Here, especially the edge part of each microlens 500 is formed of the first film 220 the etching rate of which differs from that of the transparent plate member 210.

As shown in FIG. 4, the microlens 500 is generally formed into a semielliptical section. Specifically, a lens curved surface in the transparent plate member 210 is a pan-like non-spherical surface whose bottom is shallower than a spherical surface, that is, it is semielliptical in section. Moreover, a lens curved surface in the first film 220 rises more abruptly than such a pan-like non-spherical surface. That is, it is rectilinear in section. In each microlens 500, accordingly, the radius of curvature in the vicinity of the center becomes larger than in case of a spherical lens. A lens efficiency is enhanced in accordance with the degree of such a non-spherical surface. Further, spherical aberration diminishes, and a focal point becomes as predetermined more than in the case of the spherical lens.

In addition, as shown in FIG. 4, the lens curved surface is defined so that a tangential line Lt2 to the upper edge of the most inclined part in the first film 220, namely, the part of the lens curved surface made of the first film 220, may form an angle of, for example, 50–60 degrees with respect to a tangential line Lt1 to the upper edge of the most inclined part in the transparent plate member 210, namely, the part of the lens curved surface made of the transparent plate member 210. Accordingly, a much better lens efficiency can be attained, and irregular reflection light, etc. can be more effectively prevented from appearing, than in a case where the lens curved surface is defined gentle so as to form an angle of, for example, about 30–40 degrees, or in a case where the lens curved surface is defined abrupt so as to form an angle of, for example, about 70–80 degrees.

The angle which is formed by the tangential lines Lt1 and Lt2 is appropriately set in conformity with the specifications of the electrooptic device, whereby incident light rays collected through, not only the vicinity of the center of each microlens 500, but also the vicinity of the edge thereof, can be passed through the aperture region of the corresponding pixel when they are transmitted through a liquid crystal layer, etc. within the electrooptic device.

As the result of the above, incident light rays such as projected light rays entered from above as viewed in each of FIGS. 3 and 4 can be efficiently utilized as light rays contributing to display, by a light collection action based on each microlens 500 being the non-spherical lens. Simultaneously, owing to each microlens 500 being the non-spherical lens, spherical aberration in the exit light rays thereof can be reduced or mitigated. In consequence, a bright and vivid image display is finally realized.

Moreover, since the microlens array plate 500 of the present invention having the excellent lens characteristics in this manner is manufactured by the manufacturing method of the present invention to be described below, it is easy of manufacture, it is comparatively inexpensive, and it attains a stable quality.

As shown in FIG. 5, as one modification to this exemplary embodiment, a microlens array plate 20 may be provided with light shield films 240 defining, at least, parts of non-aperture regions in an electrooptic device in which the microlens array plate 20 is mounted. More specifically, the light shield films 240 having a checkered plan pattern may be constructed so as to solely define the checkered non-aperture regions. Alternatively, the light shield films 240 having stripe-shaped plan patterns may be constructed so as to define the checkered non-aperture regions in cooperation with other light shield films.

With the construction as shown in FIG. 5, the non-aperture regions of the respective pixels can be defined more reliably, and the light leakage, etc. between the adjacent pixels can be avoided. Further, it is permitted to reliably prevent light from entering into electronic elements, such as TFTs or TFDs, which are formed in the non-aperture regions of the electrooptic device, and in each of which the entrance of the light generates a light leakage current based on a photoelectric effect, to thereby change characteristics.

In FIG. 5, the light shield films 240 are overlaid with a protective film 241. Further, a counterelectrode or an orientation film as described later may be formed instead of, or in addition, to the protective film 241.

In the microlens array plate as shown in FIG. 5, a color filter of R (red), G (green) or B (blue) can be formed in the aperture region of each pixel partitioned by the light shield films 240.

(Electrooptic Device)

Next, the entire construction of an exemplary embodiment concerning the electrooptic device of the present invention is described below with reference to FIGS. 6 and 7. An exemplary liquid crystal device of a TFT active matrix drive scheme having built-in driver circuits is shown as one example of the electrooptic device.

Figure 6:
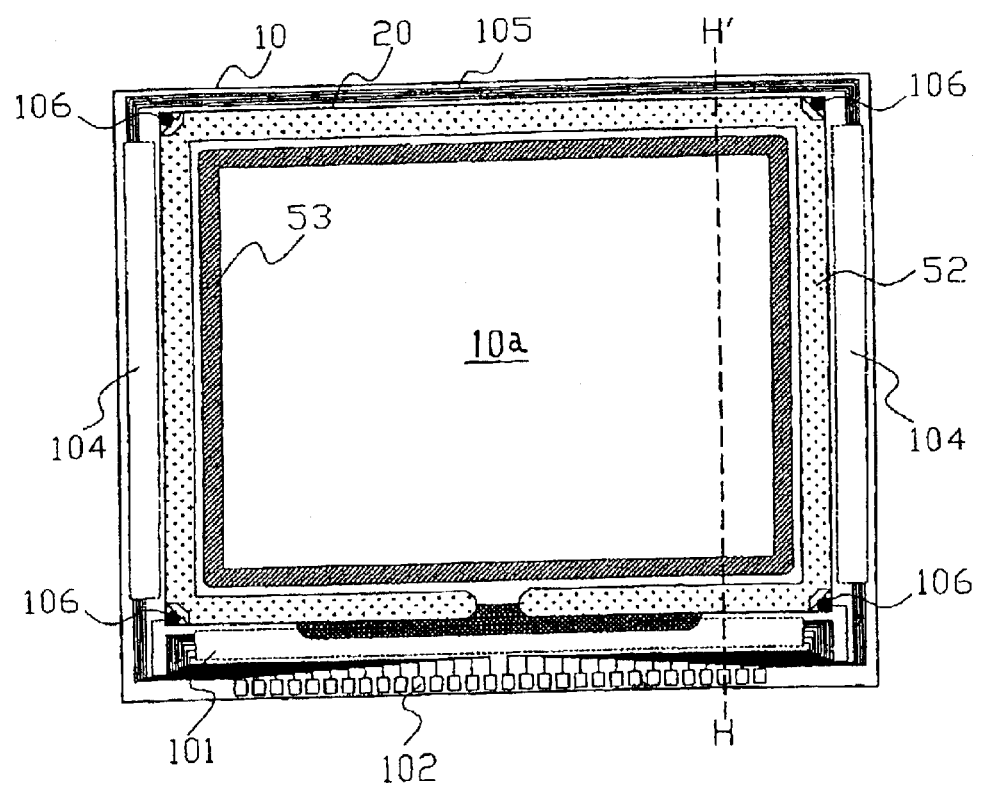
FIG. 6 is a plan view in which a TFT array substrate and various constituents formed thereon in an exemplary embodiment concerning the electrooptic device of the present invention are viewed from the side of an opposite substrate.
Figure 7:
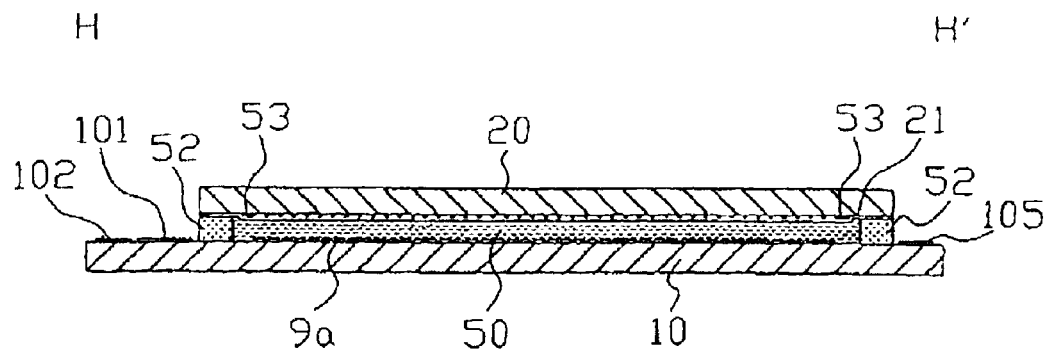
FIG. 7 is a sectional view taken along plane H–H' in FIG. 6.

FIG. 6 is a plan view in which a TFT array substrate and various constituents formed thereon are seen from the side of the foregoing microlens array plate for use as an opposite substrate, while FIG. 7 is a sectional view taken along plane H–H' in FIG. 6.

Referring to FIGS. 6 and 7, in the electrooptic device according to this exemplary embodiment, the TFT array substrate 10 and the microlens array plate 20 for use as the opposite substrate are arranged in opposition to each other. A liquid crystal layer 50 is enclosed between the TFT array substrate 10 and the microlens array plate 20, which are bonded to each other by a sealant 52 that is disposed in a sealing region located around an image display area 10a.

The sealant 52 is made of, for example, an ultraviolet-hardenable resin or a thermosetting resin to sticki both the substrates together, and the material is applied onto the TFT array substrate 10 and is thereafter hardened by ultraviolet radiation, heating or the like in a manufacturing process. A gap material, such as glass fiber or glass beads, to set the spacing (inter-substrate gap) between the TFT array substrate 10 and the microlens array plate 20 at a predetermined value is dispersed in the sealant 52. That is, the electrooptic device of this embodiment is suitable as a small-sized liquid crystal device which presents an enlarged display for the light valve of a projector. However, if the electrooptic device is a large-sized liquid crystal device presenting a full-size display, like a liquid crystal display or a liquid crystal TV receiver, such a gap material may be contained in the liquid crystal layer 50.

A frame light-shield film 53 which intercepts light and which defines the frame region of the image display area 10a, is provided on the side of the microlens array plate 20 so as to extend inside and in parallel with the sealing region where the sealant 52 is arranged. Such a frame light-shield film, however, may well be partly or entirely provided as a built-in light shield film on the side of the TFT array substrate 10.

In a peripheral region within a region spreading around the image display area as is located outside the sealing region where the sealant 52 is arranged, a data line driver circuit 101 and external circuit connection terminals 102 are disposed along one latus of the TFT array substrate 10, while scanning line driver circuits 104 are disposed along two latera adjoining the above latus. Further, a plurality of wiring lines 105 to join the scanning line driver circuits 104 disposed on both the sides of the image display area 10a are laid along one remaining latus of the TFT array substrate 10. Besides, as shown in FIG. 6, vertical conduction members 106 which function as the vertical conduction terminals between both the substrates are arranged at the four corner parts of the microlens array plate 20. On the other hand, the TFT array substrate 10 is provided with vertical conduction terminals in its regions which oppose to the above corners, respectively. Due to the vertical conduction terminals, electrical conduction can be established between the TFT array substrate 10 and the microlens array plate 20.

Referring to FIG. 7, the TFT array substrate 10 is formed with an orientation film on pixel electrodes 9a after pixel switching TFTs and the wiring lines, such as scanning lines and data lines, have been formed. On the other hand, the microlens array plate 20 is overlaid with a counterelectrode 21, in addition to the cover glass 200, transparent plate member 210 and microlenses 500 described before, and further with an orientation film at an uppermost layer part (in FIG. 7, at the lower surface of the microlens array plate 20). Besides, the liquid crystal layer 50 is made of a liquid crystal in which one kind or several kinds of nematic liquid crystal/crystals is/are mixed by way of example, and which assumes predetermined orientation states between the pair of orientation films.

The TFT array substrate 10 shown in FIGS. 6 and 7 may well be overlaid with, not only the data line driver circuit 101, scanning line driver circuits 104, etc., but also a sampling circuit which samples image signals on image signal lines and feed them to the data lines, precharge circuits which feed precharge signals of predetermined voltage level to the plurality of data lines before the feed of the image signals, respectively, an inspection circuit which serves to inspect the quality, defects, etc. of the electrooptic device midway of manufacture or at shipment, and so forth.

Figure 8:
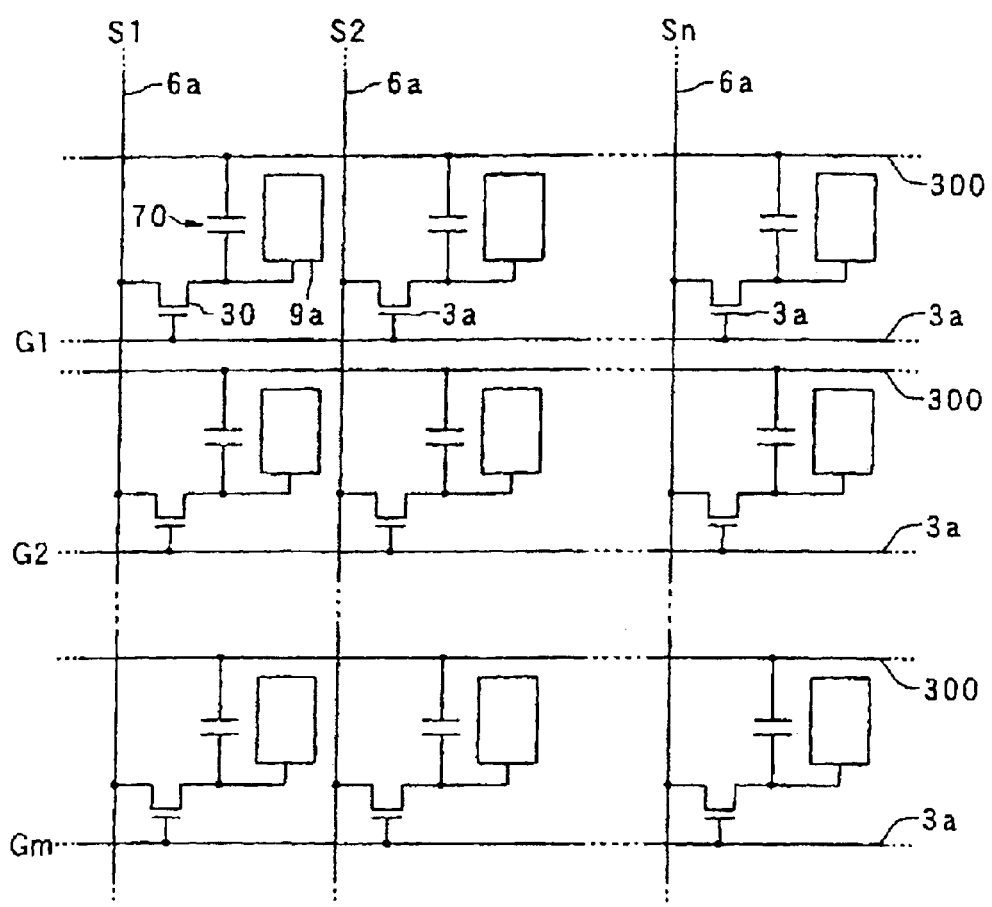
FIG. 8 is a schematic showing an equivalent circuit of several types of elements, wiring lines, etc. disposed for a plurality of matrix-shaped pixels which constitute an image display area in the exemplary embodiment concerning the electrooptic device.

Next, a circuit arrangement and an operation in the electrooptic device constructed as stated above is described below with reference to FIG. 8. FIG. 8 is a schematic showing an equivalent circuit of several types of elements, wiring lines, etc. in a plurality of pixels which are formed in the shape of a matrix and which constitute the image display area of the electrooptic device.

Referring to FIG. 8, each of a plurality of pixels, which constitute the image display area of the electrooptic device in this exemplary embodiment and which are formed in the shape of a matrix, is formed with a pixel electrode 9a, and a TFT 30 for the switching control of the pixel electrode 9a. Each data line 6a which is fed with an image signal, is electrically connected to the sources of the corresponding TFTs 30. Such image signals S1, S2, . . . , and Sn are fed to the respective data lines 6a. The image signals S1, S2, , and Sn to be written into the data lines 6a in this manner may be fed in line sequence in this order, or they may well be fed to the plurality of adjacent data lines 6a every group.

Each scanning line 3a is electrically connected to the gates of the pixel switching TFTs 30, and scanning signals G1, G2, . . . , and Gm are applied to the corresponding scanning lines 3a pulse-wise at predetermined timings and in line sequence in this order. The pixel electrodes 9a are electrically connected to the drains of the corresponding TFTs 30, and they turn ON the TFTs 30 being switching elements, for a predetermined time period, whereby the image signals S1, S2, . . . , and Sn fed from the data lines 6a are respectively written at predetermined timings. The image signals S1, S2, . . . , and Sn of predetermined levels written through the pixel electrodes 9a into a liquid crystal being one example of an electrooptic substance, are respectively retained between the pixel electrodes 9a and a counterelectrode formed in an opposite substrate, for a predetermined time period. The liquid crystal modulates light and permits a gradational display in such a way that the orientation and order of its molecular aggregate are changed by the applied potential levels. In a normally-white mode, the transmission factor of the liquid crystal for entered light decreases in accordance with a voltage applied in each individual pixel unit, and in a normally-black mode, the transmission factor of the liquid crystal for entered light increases in accordance with a voltage applied in each individual pixel unit, whereby light which has a contrast conforming to the image signals exits from the electrooptic device as a whole. Here, in order to prevent the retained image signal from leaking, a storage capacitor 70 is added in parallel with a liquid crystal capacitance which is formed between the pixel electrode 9a and the counterelectrode.

Each capacitance line 300 which includes the fixed potential side capacitor electrodes of the storage capacitors 70 and which is fixed at a constant potential, is laid in parallel with the scanning line 3a.

Figure 9:
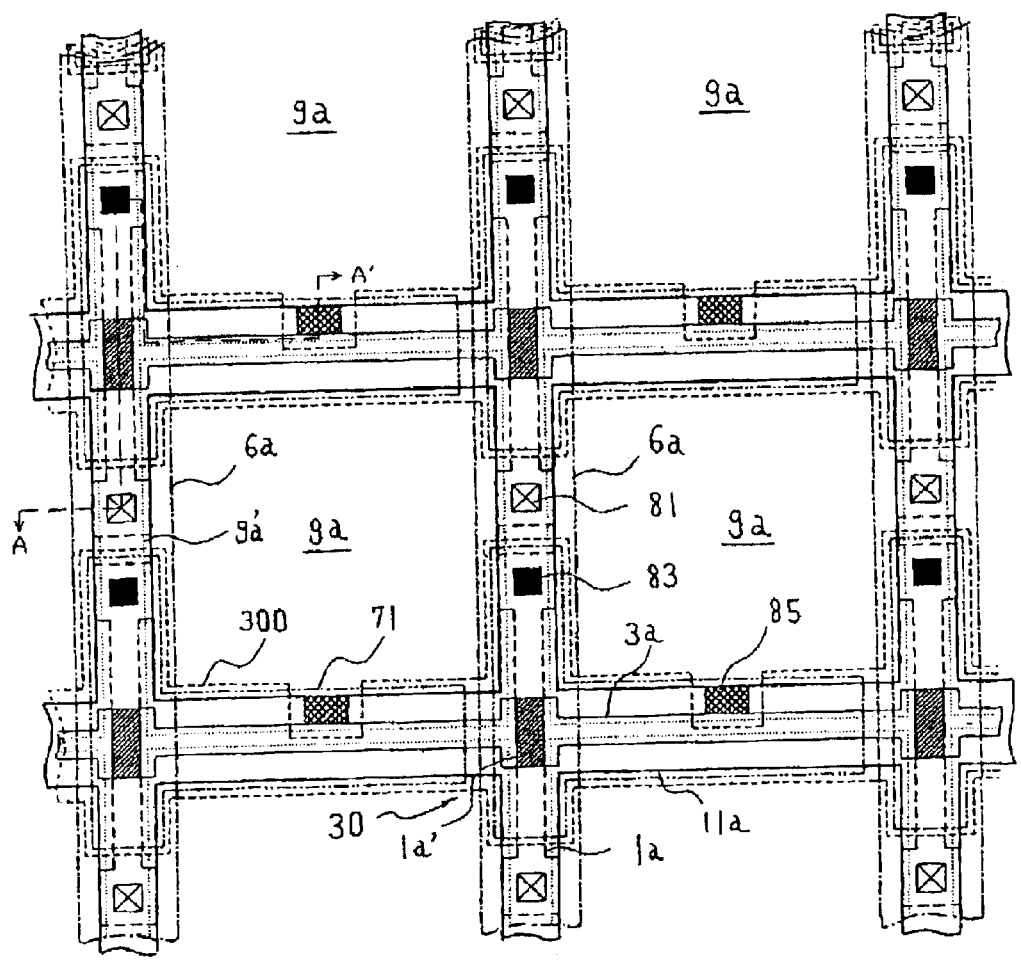
FIG. 9 is a plan view of a plurality of pixel groups adjacent to each other, on a TFT array substrate which is formed with data lines, scanning lines, pixel electrodes, etc. in the exemplary embodiment concerning the electrooptic device.
Figure 10:
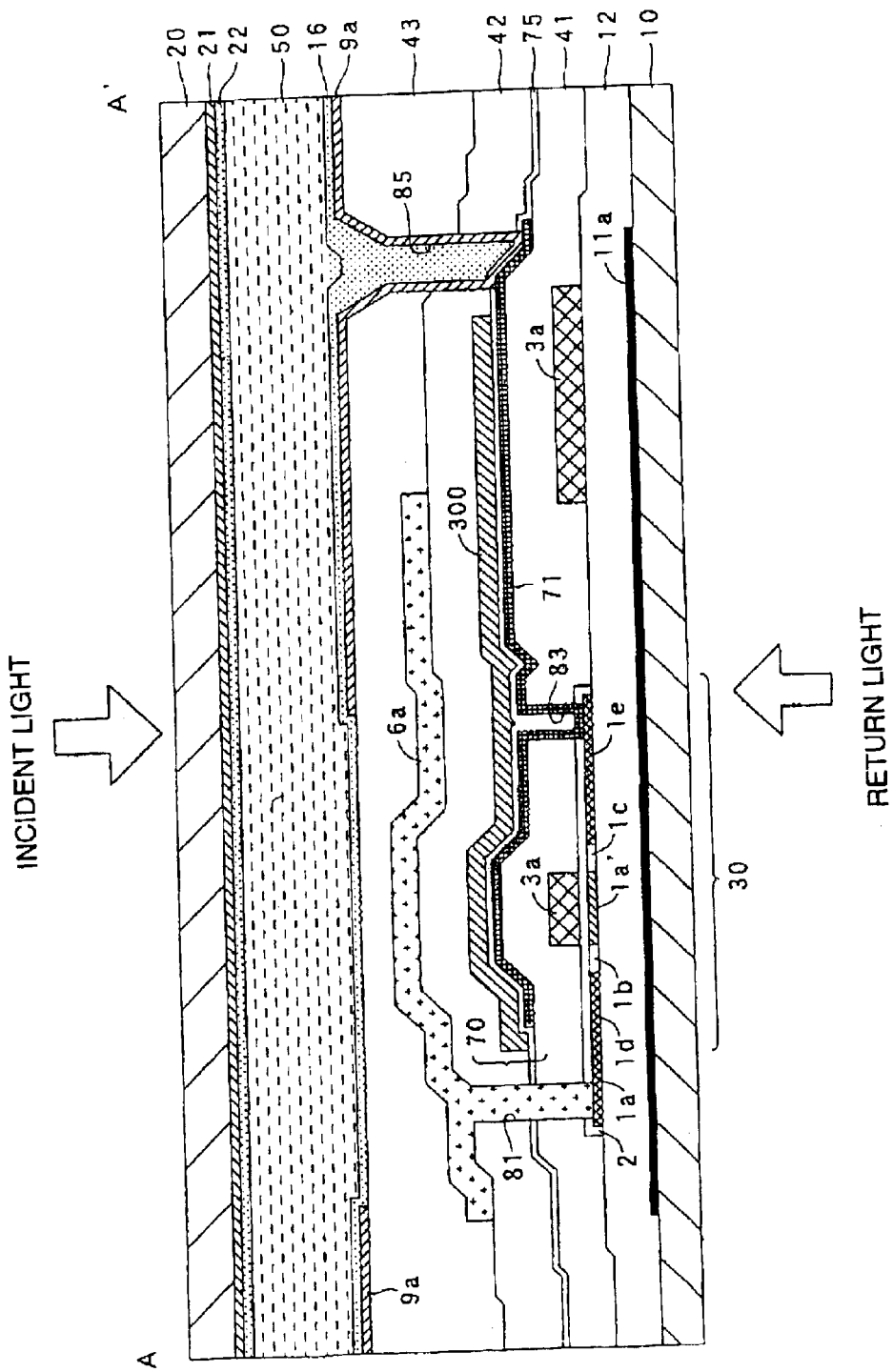
FIG. 10 is a sectional view taken along plane A–A' in FIG. 9.

Next, a construction in the image display area of the electrooptic device of the exemplary embodiment of the present invention is described below with reference to FIGS. 9 and 10. FIG. 9 is a plan view of a plurality of pixel groups adjacent to each other, on the TFT array substrate which is formed with data lines, scanning lines, pixel electrodes, etc. FIG. 10 is a sectional view taken along plane A–A' in FIG. 9. In FIG. 10, individual layers and individual members have respectively different reduced scales for the purpose of making them large enough to be more recognizable in the drawing.

Referring to FIG. 9, the plurality of transparent pixel electrodes 9a (whose contours are indicated by dotted line parts 9a') are disposed in the shape of a matrix on the TFT array substrate of the electrooptic device, and the data lines 6a and the scanning lines 3a are respectively laid along the vertical and lateral boundaries of the pixel electrodes 9a.

Each scanning line 3a is arranged so as to oppose to that channel region 1a' of a semiconductor layer 1a which is indicated by a region of rightward rising hatches in the drawing, and it functions as the gate electrode. In this manner, the pixel switching TFT 30 for which the scanning line 3a is arranged as the gate electrode in opposition to the channel region 1a' is disposed in each place where the scanning line 3a and the data line 6a intersect.

As shown in FIGS. 9 and 10, each storage capacitor 70 is formed in such a way that a relay layer 71 being the pixel potential side capacitance electrode which is connected to the heavily-doped drain region 1e of the TFT 30 and to the pixel electrode 9a, and part of the capacitance line 300 being the fixed potential side capacitance electrode are arranged in opposition to each other through a dielectric film 75.

When viewed in plan, each capacitance line 300 stretches in the shape of a stripe along the scanning line 3a, and its part overlapping the TFT 30 protrudes up and down in FIG. 9. Such a capacitance line 300 should preferably be formed of, for example, a light-intercepting conductive film which contains a metal. When thus constructed, the capacitance line 300 has, not only the function of the fixed potential side capacitance electrode of the storage capacitor 70, but also the function of a light shield layer which shields the TFT 30 from incident light on the upper side of this TFT 30.

On the other hand, lower light shield films 11a are disposed in a checkered pattern on the lower sides of the TFTs 30 over the TFT array substrate 10. Each lower light shield film 11a is made of, for example, a metal element, an alloy, a metal silicide or a poly-silicide containing at least one of refractory metals, such as Ti (titanium), Cr (chromium), W (tungsten), Ta (tantalum) and Mo (molybdenum), or a stacked layer made of such materials.

The data lines 6a respectively extending in the vertical direction in FIG. 9, and the capacitance lines 300 respectively extending in the lateral direction in FIG. 9 are formed intersecting with each other, and the lower light shield films 11a are formed in the checkered pattern, whereby the non-aperture regions of the respective pixels are defined.

As shown in FIGS. 9 and 10, each data line 6a is electrically connected through a contact hole 81 to the heavily-doped source region 1d of the semiconductor layer 1a which is made of, for example, a poly-silicon film. Incidentally, a relay layer made of the same film as that of the above relay layer 71 may well be formed so as to electrically connect the data line 6a and the heavily-doped source region 1d through that relay layer as well as two contact holes.

It is favorable that each capacitance line 300 is extended from the image display area 10a (refer to FIG. 6) where the pixel electrodes 9a are arranged, to the surroundings thereof, and that it is electrically connected with a constant potential source so as to be held at a fixed potential. Such a constant potential source may be the constant potential source of a positive supply voltage or negative supply voltage which is fed to the data line driver circuit or scanning line driver circuits, or it may be a constant potential which is fed to the counterelectrode 21 of the microlens array plate 20. Further, each lower light shield film 11a disposed under the TFT 30 may be extended from the image display area 10a to the surroundings thereof and connected to a constant potential source likewise to the capacitance line 300, in order to reduce or prevent the potential fluctuation of this film 11a from affecting the TFT 30 adversely.

Each pixel electrode 9a is relayed by the relay layer 71, thereby to be electrically connected to the heavily-doped drain region 1e of the semiconductor layer 1a through contact holes 83 and 85.

In FIGS. 9 and 10, the electrooptic device includes the transparent TFT array substrate 10, and the microlens array plate 20 (refer to FIGS. 1 through 4) which is arranged in opposition to the substrate 10. The TFT array substrate 10 is made of, for example, a quartz substrate, a glass substrate or a silicon substrate.

As shown in FIG. 10, the TFT array substrate 10 is provided with each pixel electrode 9a, which is overlaid with an orientation film 16 subjected to a predetermined orientation treatment such as rubbing. The pixel electrode 9a is made of a transparent conductive film, for example, ITO film. The orientation film 16 is made of a transparent organic film, for example, polyimide film.

On the other hand, the microlens array plate 20 is provided with the counterelectrode 21 over the whole area thereof, and the counterelectrode 21 is underlaid with an orientation film 22 subjected to a predetermined orientation treatment such as rubbing. The counterelectrode 21 is made of a transparent conductive film, for example, ITO film. Besides, the orientation film 22 is made of a transparent organic film, such as polyimide film.

The microlens array plate 20 may well be provided with light shield films 240 of checkered pattern or striped shape in correspondence with the non-aperture regions of the respective pixels as shown in FIG. 5. When such a construction is adopted, incident light from the side of the microlens array plate 20 can be more reliably hindered from entering the channel region 1a' and a lightly-doped source region 1b as well as a lightly-doped drain region 1c, by each light shield film 240 over the microlens array plate 20 together with the capacitance line 300 and the data line 6a which define the non-aperture region as stated before.

A liquid crystal which is one example of the electrooptic substance is enclosed between the TFT array substrate 10 and the microlens array plate 20 which are thus constructed and which are arranged with the pixel electrodes 9a and the counterelectrode 21 facing to each other, and in a space surrounded with a sealant 52 (refer to FIGS. 6 and 7), whereby a liquid crystal layer 50 is formed.

Further, a subbing insulating film 12 is provided under the pixel switching TFTs 30. The subbing insulating film 12 has the function of insulating each TFT 30 from the lower light shield film 11a for the inter-layer insulation. Besides, since the subbing insulating film 12 is formed over the whole area of the TFT array substrate 10, it has the function of preventing the characteristics of the pixel switching TFTs 30 from changing due to the roughness of the TFT array substrate 10 in the surface polishing thereof, the dirt of the TFT array substrate 10 remaining after the wash thereof, etc.

Referring to FIG. 10, each pixel switching TFT 30 has an LDD (Lightly Doped Drain) structure. It is constituted by the scanning line 3a, that channel region 1a' of the semiconductor layer 1a in which a channel is formed by an electric field from the scanning line 3a, an insulating film 2 which includes a gate insulating film insulating the scanning line 3a and the semiconductor layer 1a, the lightly-doped source region 1b as well as the lightly-doped drain region 1c of the semiconductor layer 1a, and the heavily-doped source region 1d as well as the heavily-doped drain region 1e of the semiconductor layer 1a.

Formed on the scanning line 3a is a first inter-layer insulating film 41 in which the contact hole 81 leading to the heavily-doped source region 1d, and the contact hole 83 leading to the heavily-doped drain region 1e are respectively provided.

The first inter-layer insulating film 41 is overlaid with the relay layer 71 and the capacitance line 300, which are overlaid with a second inter-layer insulating film 42 where the contact hole 81 leading to the heavily-doped source region 1d and the contact hole 85 leading to the relay layer 71 are respectively provided.

The data line 6a is formed on the second inter-layer insulating film 42, and they are overlaid with a third inter-layer insulating film 43 which is flattened and which is formed with the contact hole 85 leading to the relay layer 71. The pixel electrodes 9a are provided on the upper surface of the third inter-layer insulating film 43 thus constructed.

In this exemplary embodiment, the surface of the third inter-layer insulating film 43 has been flattened by a CMP (Chemical Mechanical Polishing) treatment or the like, thereby to lessen the orientation defects of the liquid crystal in the liquid crystal layer 50 as are caused by stepped parts ascribable to the various wiring lines and elements existing under this film 43.

Figure 11:
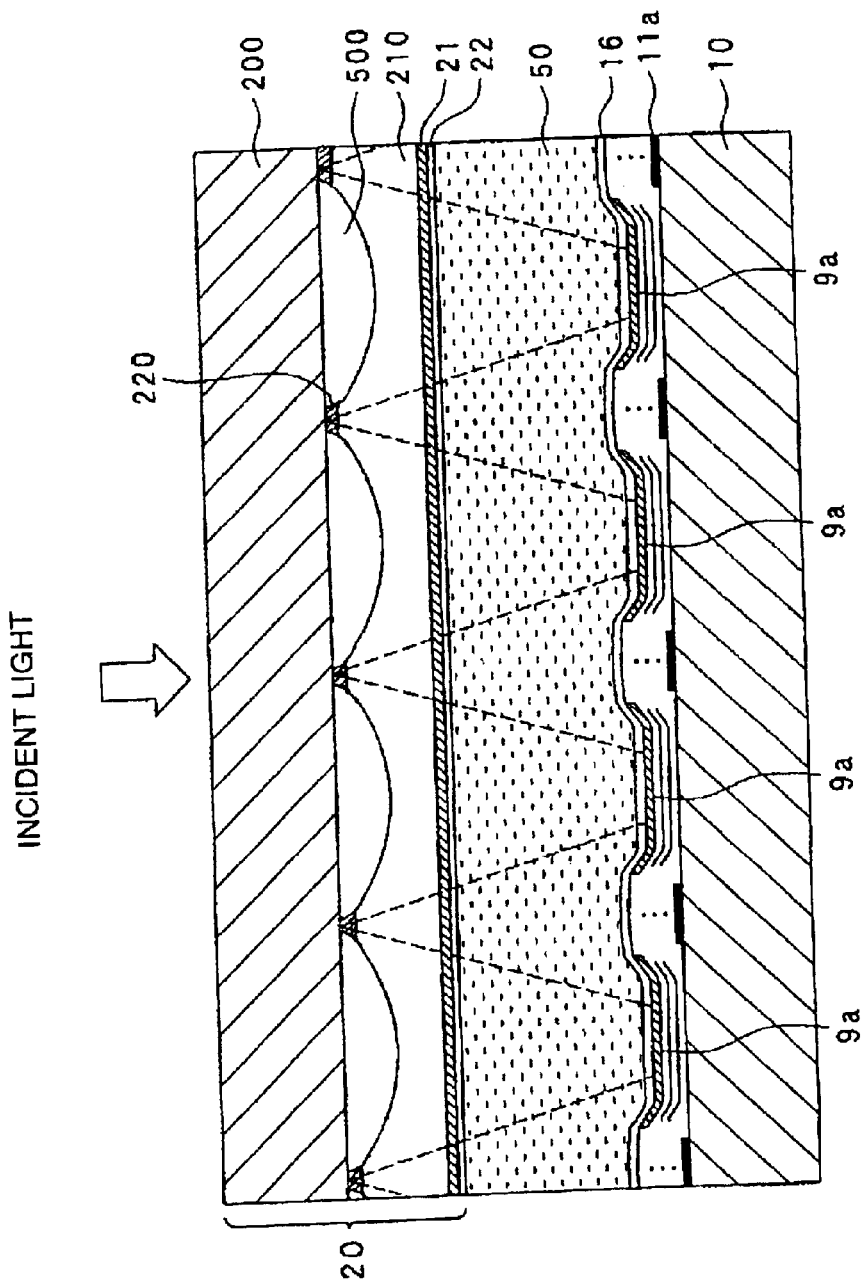
FIG. 11 is a sectional view schematically showing a situation where incident light rays are collected by each microlens of the microlens array plate used as an opposite substrate, in the exemplary embodiment concerning the electrooptic device.

The light collecting function of the microlens array plate 20 in the electrooptic device is described below with reference to FIG. 11. FIG. 11 is a sectional view schematically showing a situation where incident light rays are collected by each microlenses 500 of the microlens array plate 20 used as the opposite substrate. By the way, in FIG. 11, each microlens 500 is arranged so as to be coaxial with the corresponding pixel.

As shown in FIG. 11, the microlens array plate 20 includes the plurality of microlenses 500 which are arranged in the form of a matrix and by which the incident light rays entered from above as viewed in the figure are collected onto the respectively corresponding pixel electrodes 9a, and the reflective film 220 which is formed at the edge part of each lens. Besides, the counterelectrode 21 and the orientation film 22 are formed on the transparent plate member 210 (on the lower side as viewed in the figure).

Due to the construction as described above, according to the electrooptic device of this exemplary embodiment, the incident light rays from the side of the microlens array plate 20 are collected onto the respectively corresponding pixel electrodes 9a by the plurality of microlenses 500. Accordingly, an effective opening rate in each pixel is heightened more than in a case where the microlens 500 is not existent, or in a case where the reflective film 220 is not existent at the edge part of the microlens 500.

In this exemplary embodiment, each microlens 500 especially has a non-spherical surface, and it exhibits an excellent lens efficiency and a slight spherical aberration. Therefore, the utilization efficiency of the incident light rays is very high.

In each of the exemplary embodiments described with reference to FIGS. 1 through 11 in the above, the data line driver circuit 101 and the scanning line driver circuits 104 are disposed on the TFT array substrate 10, but they may alternatively be electrically and mechanically connected to a driving LSI which is mounted on, for example, a TAB (Tape Automated Bonding) substrate, through an anisotropic conductive film which is disposed at the peripheral part of the TFT array substrate 10. Besides, a polarization film, a phase difference film, a polarizing plate, etc. are arranged in predetermined directions on each that side of the microlens array plate 20 from which projected light enters, and on that side of the TFT array substrate 10 from which exit light emerges, in accordance with, for example, operation modes such as a TN (Twisted Nematic) mode, a VA (Vertically Aligned) mode and a PDLC (Polymer Dispersed Liquid Crystal) mode, and either of a normally white mode and a normally black mode.

In the exemplary embodiment shown in FIGS. 6 through 11, the microlens array plate 20 as shown in FIGS. 1 through 4 is employed as the opposite substrate, but it is also possible to utilize such a microlens array plate 20 as the TFT array substrate 10. Alternatively, it is possible to mount the microlens array substrate 20 on the side of the TFT array substrate 10, in such a way that a glass substrate or the like which is simply formed with a counterelectrode and an orientation film (not the microlens array plate 20) is used as the opposite substrate. That is, the structure of the present invention (refer to FIGS. 1 through 4) including the microlenses, the reflective film at the edge parts of the lenses, and the light shield films can be formed or mounted on the side of the TFT array substrate 10.

The present invention is also applicable to other electrooptic devices such as an electroluminescent device and an electrophoretic device.

(Method of Manufacturing Microlens Array Plate)

Next, a method of manufacturing a microlens array plate 20 according to this exemplary embodiment is described below with reference to FIGS. 12(a)–12(f).

Figure 12:
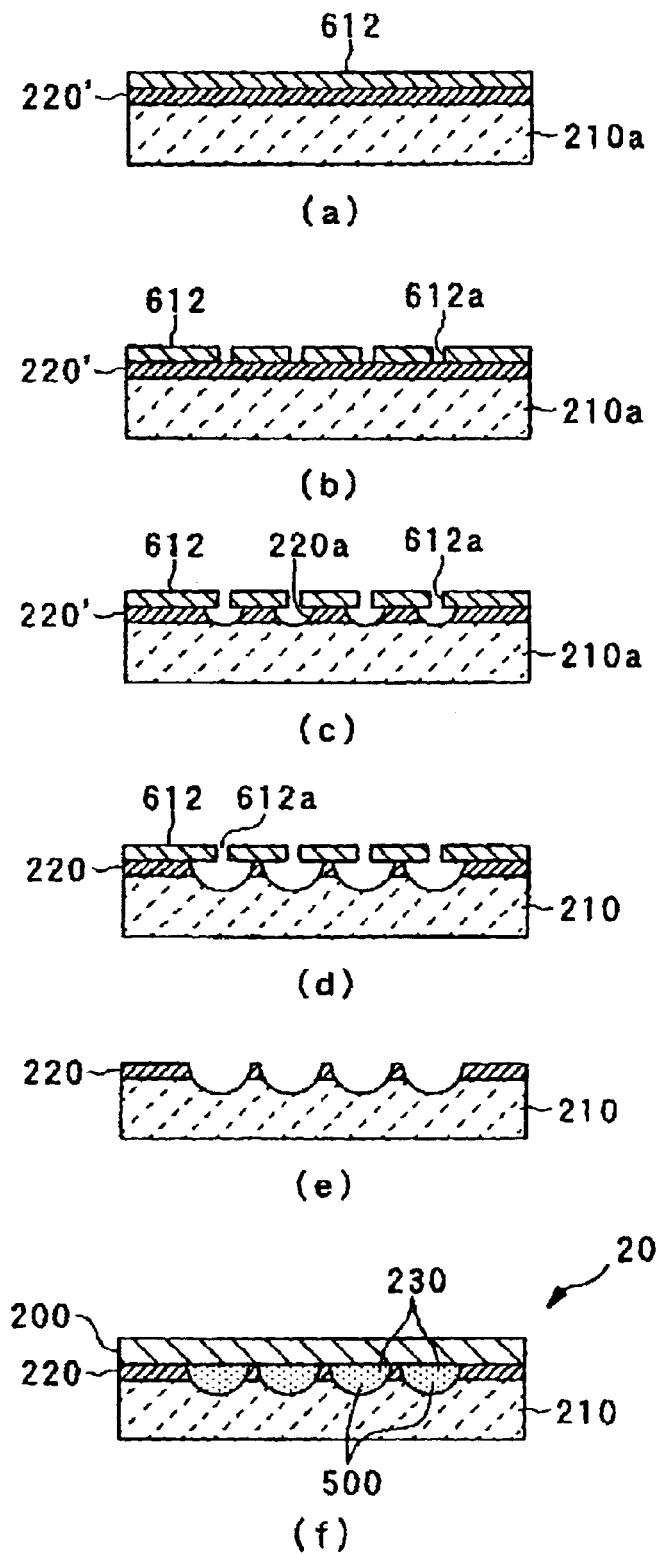
FIGS. 12(a)–12(f) are schematics showing processing steps of a method of manufacturing the microlens array plate.

First, as shown in FIG. 12(a), a transparent plate member 210a made of quartz or the like is overlaid with a first film 220' the etching rate of which for a predetermined kind of etchant, for example, one of hydrofluoric acid type is higher than that of the transparent plate member 210a. Such a first film 220' is formed of a transparent silicon oxide film by, for example, CVD or sputtering. Thereafter, the first film 220' is subjected to a heat treatment or annealing at a predetermined temperature of, for example, about 800–900° C. so as to be baked, thereby to control its etching rate. On this occasion, the transparent plate member 210 is made of, for example, quartz, and hence, such a problem as the destruction of the transparent plate member 210a does not especially occur in spite of such a heat treatment at the comparatively high temperature.

At the subsequent step, a mask layer 612 is formed of a poly-silicon film on the first film 220' by, for example, CVD or sputtering.

Subsequently, as shown in FIG. 12(b), pits 612a are provided at positions corresponding to the centers of microlenses to-be-formed, by patterning which employs photolithography and etching for the mask 612. On this occasion, each pit 612a is provided so that its diameter may become small as compared with the diameter of each microlens 500 to-be-formed. Subsequently, as shown in FIG. 12(c), the first film 220' and the transparent plate member 210a are wet-etched with an etchant of hydrofluoric acid type, or the like through the mask 612 which is provided with such pits 612a. Then, the first film 220' is etched faster because the etching rate of this first film 220' for the etchant is higher than that of the transparent plate member 210a. More specifically, before the etching penetrates through the first film 220', spherical recesses are excavated in the parts of the first film 220' around the pits 612a by the wet etching which has no directionality, but after the penetration, the first film 220' is etched faster. Therefore, the etching spreads sidewards faster than in the depthwise direction of the pits 612a, that is, side etching proceeds relatively much, so that recesses 220a each being in the shape of a pan of shallow bottom are excavated around the pits 612a.

Thereafter, as shown in FIG. 12(d), the etching is ended at a stage where recesses each of which has a size corresponding to the microlens 500 have been excavated by a time period control or the like. That is, the transparent plate member 210 in which the recess in the shape of a shallow-bottomed pan is excavated every microlens is completed. Thus, there is obtained a structure which is peculiar to the present invention and in which a first film 220 is left in the vicinity of the edge of each recess and on the upper surface of the transparent plate member 210.

In this exemplary embodiment, the etching rate is especially controlled by condition setting which concerns at least one of the sort of the first film 220' relating to, for example, a substance, a density and a porosity; the method of forming the first film 220', for example, the CVD or the sputtering; a temperature for forming the first film 220', for example, one below about 400° C. or one of about 400–1000° C.; and the temperature of the heat treatment or the annealing after the formation of the first film 220'. By way of example, regarding the CVD and the sputtering, the latter densifies the first film 220' more and can make the etching rate thereof higher. Also, regarding the heat treatment after the formation of the first film 220', when the temperature is heightened, the first film 220' is densified more, and the etching rate thereof can be lowered, and conversely, when the temperature is lowered, the etching rate of the first film 220' can be heightened. Due to such a control of the etching rate, a curvature or a curvature distribution in a non-spherical surface which each recess to be finally obtained defines can be controlled comparatively easily.

The curvature or the curvature distribution in the non-spherical surface which each recess to be finally obtained defines can also be controlled by the thickness of the first film 220'.

The several conditions of controlling the etching rate and the thickness of the first film 220' as stated above may be individually and concretely set by an experimental, empirical, theoretical or the like approach or by a simulation, in accordance with the size of each microlens 500 to be actually employed, a performance required of the microlens 500, the specifications of a device, and so forth.

Subsequently, as shown in FIG. 12(e), the mask layer 612 is removed by an etching process. The step of FIG. 12(e) can be dispensed with when the thickness of the mask 612 is set so that this mask layer 612 may be completely removed by the etching at the step of FIG. 12(d).

Subsequently, as shown in FIG. 12(f), the surfaces of the microlenses 500 is coated with a thermosetting transparent adhesive, and a cover glass 200 made of Neoceram (trade name), quartz or the like is pressed against the adhesive so as to harden this adhesive. Thus, the microlens 500 is finished up which is so constructed that each recess excavated in the transparent plate member 210 is filled up with a bonding layer 230. On this occasion, the non-spherical microlenses 500 each of which is made up of a convex lens can be fabricated comparatively easily by forming the bonding layers 230 the refractivity of which is higher than that of the transparent plate member 210.

At the step shown in FIG. 12(f), the cover glass 200 may well be polished so as to have a desired thickness.

As described above, according to the manufacturing method of this exemplary embodiment, the microlens array plate 20 in which the non-spherical microlenses 500, as shown in FIGS. 1 through 4, are formed in the shape of an array can be manufactured comparatively efficiently.

Besides, microlenses of biconvex lenses can be manufactured in such a way that the transparent plate members 210 at the stage where the recesses shown in FIG. 12(e) have been completed are prepared in the number of two, and that they are stuck to each other. Alternatively, non-spherical microlenses can be manufactured in such a way that the recesses shown in FIG. 12(e) are utilized as a mold in the 2P method or the like.

In addition, in case of manufacturing the microlens array plate in the modification shown in FIG. 5, the light shield films 240 and the protective film 241 and the like may be formed in this order by sputtering, coating or the like, subsequently to the above step shown in FIG. 12(f).

(Exemplary Embodiment of Electronic Equipment)

Figure 13:
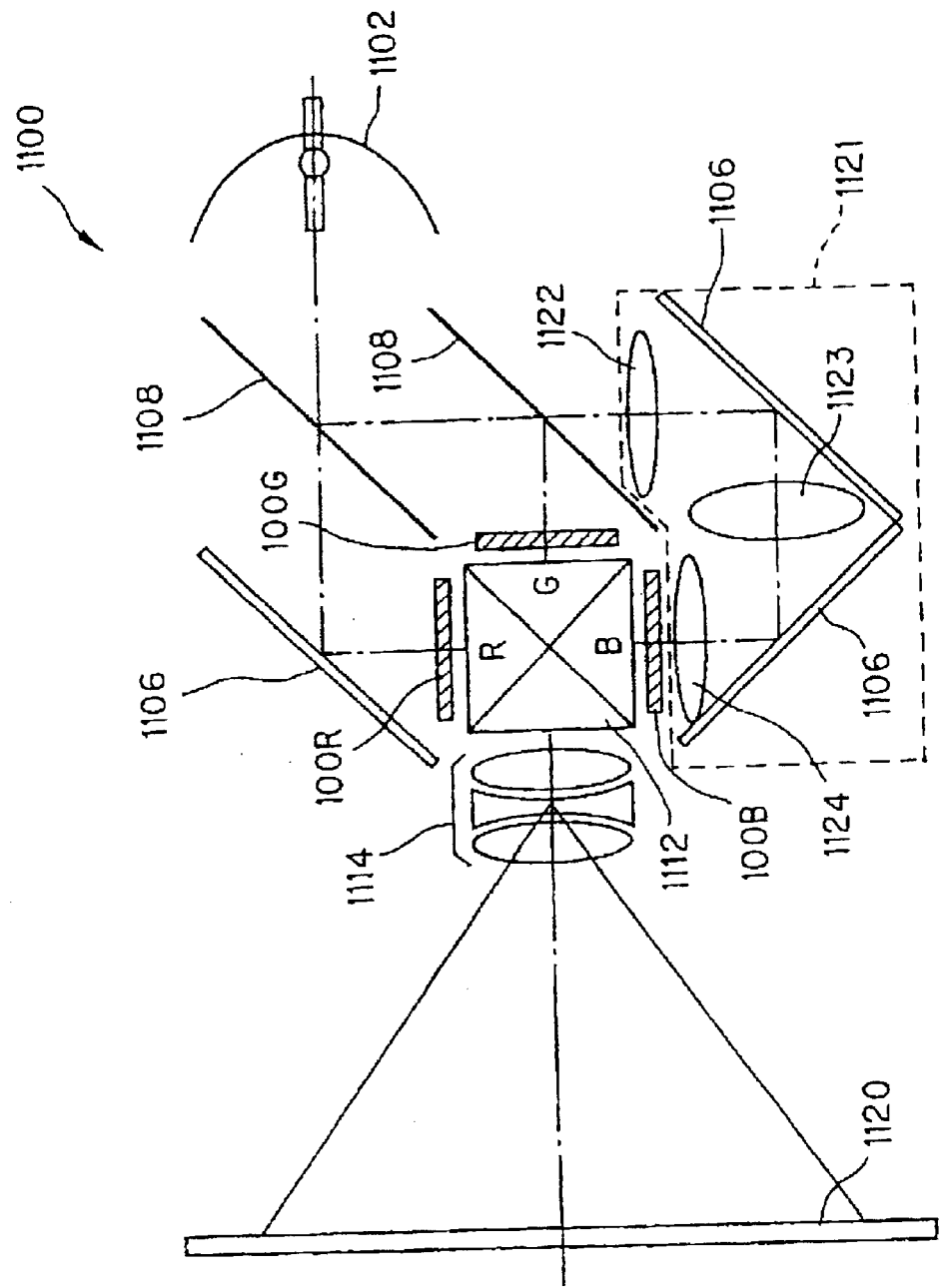
FIG. 13 is a schematic sectional view showing a color liquid-crystal projector which is one example of a multiple-plate type color projector in accordance with an exemplary embodiment of the electronic equipment of the present invention.

Next, an exemplary embodiment of a multiple-plate type color projector that is a practicable example of electronic equipment, in which the electrooptic device explained above in detail is employed as a light valve, is described below concerning the entire construction thereof, particularly the optical construction thereof. FIG. 13 is a schematic sectional view of the multiple-plate type color projector.

Referring to FIG. 13, a liquid crystal projector 1100 which is one example of the multiple-plate type color projector in this exemplary embodiment is constructed as a projector in which three liquid-crystal modules each of which includes the electrooptic device having the driver circuits mounted on the TFT array substrate are prepared and are respectively employed as light valves 100R, 100G and 100B for colors RGB.

In the liquid crystal projector 1100, when projection light is emitted from a lamp unit 1102 having a white light source such as metal halide lamp, it is decomposed into light components R, G and B respectively corresponding to the three primary colors RGB, by three mirrors 1106 and two dichroic mirrors 1108, and the light components R, G and B are respectively guided to the light valves 100R, 100G and 100B of the corresponding colors. On this occasion, in order to prevent a light loss ascribable to a long optical path, the light B is especially guided through a relay lens system 1121 which consists of an entrance lens 1122, a relay lens 1123 and an exit lens 1124. Besides, the light components corresponding to the three primary colors, respectively modulated by the light valves 100R, 100G and 100B are composed again by a dichroic prism 1112. Thereafter, the resulting composed light is projected as a color image on a screen 1120 through a projection lens assembly 1114.

The present invention is not restricted to the exemplary embodiments stated above, but it shall be appropriately alterable within a scope not departing from the purport or idea of the invention read from the claims and the entire specification. A method of manufacturing a microlens, a microlens, an electrooptic device and an electronic equipment accompanied by such alterations shall also be covered within the technical scope of the present invention.

What is claimed is:

1. A method of manufacturing a microlens, comprising:

forming on a substrate a film having an etching rate for a predetermined kind of etchant that differs from an etching rate of the substrate;

forming on the film a mask in which a pit is provided at a position corresponding to a center of the microlens to-be-formed; and performing wet etching through the mask to thereby excavate in the substrate a non-spherical recess which defines a curved surface of the microlens.

2. The method of manufacturing a microlens according to claim 1, the film being higher in the etching rate than the substrate.

3. The method of manufacturing a microlens according to claim 1, further including:

forming the substrate of a transparent substrate; and putting into the recess a transparent medium which has a refractivity higher than a refractivity of the transparent substrate.

4. The method of manufacturing a microlens according to claim 1, further including:

forming the film of at least one of a transparent film and an opaque film.

5. The method of manufacturing a microlens according to claim 1, further including:

forming the film of at least one of a silicon oxide film and a silicon nitride film.

6. The method of manufacturing a microlens according to claim 1, further including:

controlling the etching rate by condition setting which concern at least one of a sort of the film, forming the film, a condition to form the film, and a temperature of a heat treatment after the formation of the film.

7. The method of manufacturing a microlens according to claim 1, further including:

forming the mask of at least one of a poly-silicon film, an amorphous silicon film and a hydrofluoric acid-proof film.

8. The method of manufacturing a microlens according to claim 1, further including:

forming a plurality of such microlenses in a shape of an array on the substrate.

9. A microlens manufactured by the method of claim 1.

10. An electrooptic device, comprising:

the microlens of claim 9;

a displaying electrode opposing the microlens; and at least one of a wiring line and an electronic element connected to the displaying electrode.

11. An electronic equipment, comprising:

the electrooptic device of claim 10.

* * * * *